United States Patent [19]

Terakawa et al.

[11] Patent Number: 4,868,520
[45] Date of Patent: Sep. 19, 1989

[54] HIGH-FREQUENCY POWER SYNTHESIZING APPARATUS

[75] Inventors: Takashige Terakawa; Noriyuki Akaba, both of Tokyo; Sadayoshi Hattori, Yokohama, all of Japan

[73] Assignee: Tokyo Keiki Co., Ltd., Tokyo, Japan

[21] Appl. No.: 133,660

[22] Filed: Dec. 16, 1987

[30] Foreign Application Priority Data

Dec. 20, 1986 [JP] Japan .................................. 61-304866
Dec. 23, 1986 [JP] Japan .................................. 61-31404
Dec. 23, 1986 [JP] Japan .................................. 61-310405
Dec. 23, 1986 [JP] Japan .................................. 61-310406

[51] Int. Cl.$^4$ ............................................. H03F 3/68
[52] U.S. Cl. ...................................... 330/295; 330/54; 330/286
[58] Field of Search .................... 330/29 S, 53, 54, 55, 330/56, 286; 333/117, 121

[56] References Cited

U.S. PATENT DOCUMENTS 4,618,831 10/1986 Egami et al. ........................ 330/295
4,700,108 10/1987 Morse .................................... 330/53

Primary Examiner—Gene Wan
Attorney, Agent, or Firm—Sandler & Greenblum

[57] ABSTRACT

A high-frequency power synthesizing apparatus having a plurality of distributors arranged in a plurality of stages, a plurality of amplifiers which are supplied with outputs from a final stage of said power distributors and which amplify these outputs to a predetermined level, and a power synthesizing unit including initial-stage power synthesizers supplied with outputs from said amplifiers and a final-stage synthesizer which outputs power to an external load. The final-stage power distributors and the initial stage synthesizers are constituted by 0°-hybrid modules. The output level of each amplifier is regulated and made constant by being compared with a predetermined level. The output levels of the amplifiers can be displayed on an external display.

32 Claims, 8 Drawing Sheets

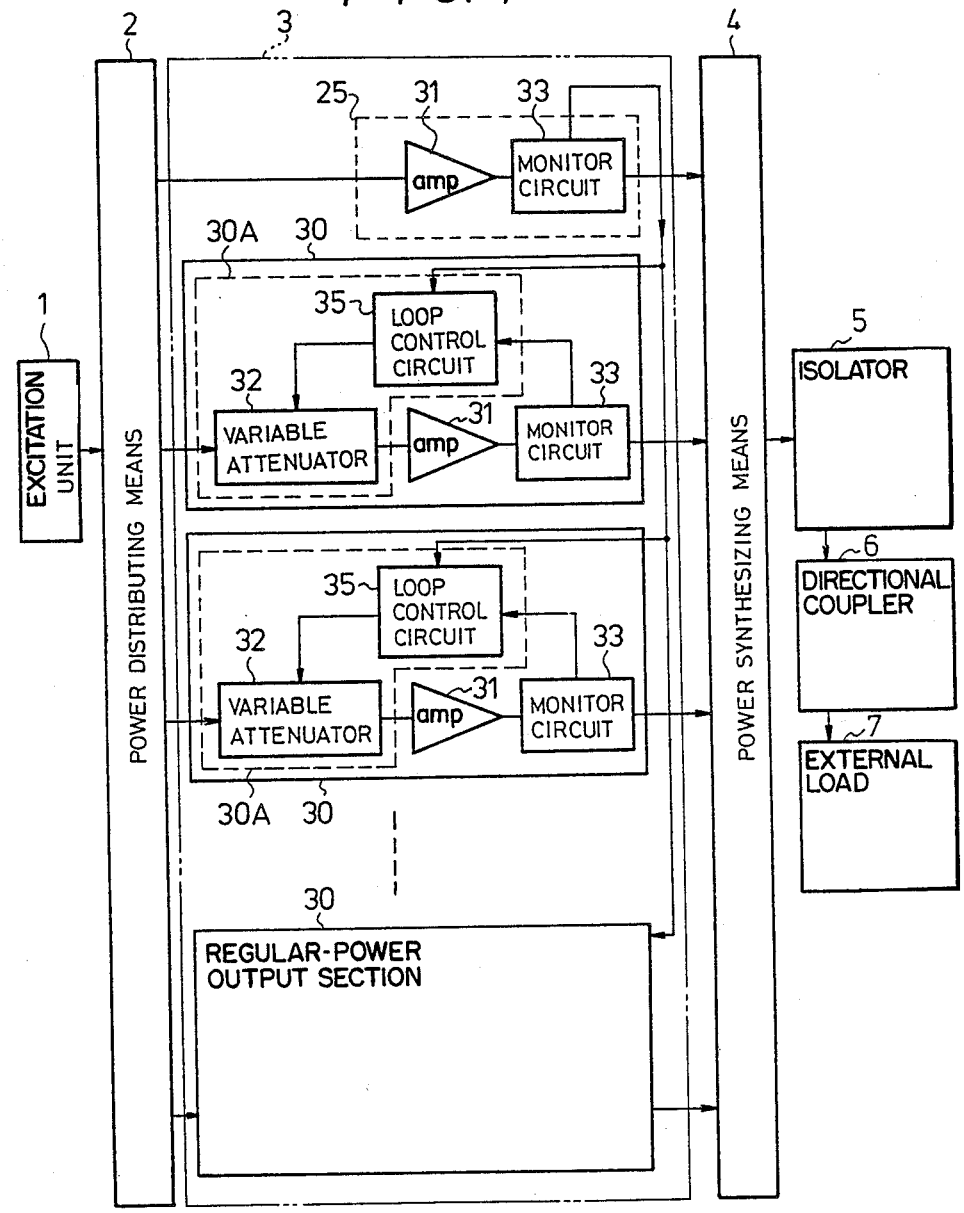

HIGH-FREQUENCY POWER SYNTHESIZING APPARATUS

BACKGROUND OF THE INVENTION

1. Field of the Invention

This invention relates to a high-frequency power synthesizing apparatus and, more particularly, to a high-frequency power synthesizing apparatus based on a power synthesizing method.

2. Description of the Prior Art

High-frequency power synthesizing apparatuses in general make use of microwave electronic tubes and, therefore, cannot be reduced in size, and they experience other problems in operation, such as heat generation. For this reason, development of high-frequency power synthesizing apparatuses using semiconductor devices is now being promoted.

In a high-frequency power synthesizing apparatus using semiconductor devices, especially when this kind of apparatus is of a high-output type, a single amplifier cannot sustain an operation necessary to generate the required power. To cope with this, a type of high-frequency power synthesizing apparatus based on a method of power synthesis has been made public.

A typical circuit module for use in a power synthesizing method is of a 90°-hybrid type.

FIGS. 8 to 10 show a high-frequency power synthesizing apparatus for synthesizing power to applying 90°-hybrid modules. As shown in FIGS. 8 to 10, the high-frequency power synthesizing apparatus is constituted by an excitation unit 1, a power distributing means 50 which is connected to the excitation unit 1 and which comprises power distributors arranged in a plurality of stages, an amplifying means 60 consisting of a plurality of amplifiers 60a to 60h which are supplied with outputs from final-stage power distributors 50A to 50D which constitute part of the power distributing means 50, and which amplify them to predetermined levels, and a power synthesizing means 70 which comprises a plurality of synthesizers 70A to 70D which are supplied with outputs from the amplifying means 60, and a synthesizer which is disposed at a stage following those of the synthesizers 70A to 70D. The output from this high-frequency power synthesizing apparatus is supplied to an external load 7 via an output terminal B, an isolator 5, and a directional coupler 6.

All of the power distributors 50A to 50D and the power synthesizers 70A to 70D are of 90°-hybrid modules. In the operation of distributing, amplifying and synthesizing power by the thus-constructed high-frequency power synthesizing apparatus, the total reflection coefficient due to phase shifts between reflection waves as seen from input terminals A and B is greatly reduced.

However, with respect to each of the 90°-hybrid modules, the distance S between the terminals is not less than ¼ wavelength of the operating frequency, as shown in FIG. 8, and the width W of the 90°-hybrid module cannot be reduced to be equal to or below ¼ wavelength.

For this reason, pairs of power distributors 50A and 50B, 50C and 50D on the input side of the amplifying means 60 and pairs of power synthesizers 70A and 70B, 70C and 70D on the output side of the amplifying means 60 are necessarily arranged in such a manner that they face each other in a surface contacting manner, as shown in FIG. 10.

In the high-frequency power synthesizing apparatus, it is necessary to prevent excessive heating by using a suitable heat sinking means in order to limit internal heating. However, the above arrangement cannot ensure sufficient heat sinking effects, and this sometimes results in malfunctions of the apparatus.

Moreover, the distance between the terminals of each of the amplifiers 60a to 60h must be increased if the outputs from the multiplicity of amplifiers 60a to 60h is synthesized at a comparatively low frequency, thereby necessitating relatively long cables for connection to the amplifiers 60a to 60h. For this reason, too, the size of the apparatus is inevitably increased and, at the same time, troublesome tasks of wiring and adjusting the wiring are involved.

The power distributing means 50 and the power synthesizing means 70 used in the above-described power synthesizing method are used to obtain a high level of high-frequency output, and, specifically, the power synthesizing means 70 is required to operate smoothly at a high level of power. Also, for effective power synthesis, there are strict conditions in respect of of characteristics dispersion imposed upon the amplifiers 60a to 60h, such as the equality of amplitude of the outputs from these amplifiers and the predetermined relationship between the phases thereof.

However, the tolerance within which dispersion of the amplitude and phase characteristics of each may be amplified relative to the others is very narrow. Therefore, to substantially equalize the amplitude and phase characteristics of the amplifiers over the entire operating range from low power to high power, it is necessary to consider an abnormality check and changes in temperature when the gain of each amplifier is adjusted or when power is synthesized. This is time-consuming and troublesome.

If such adjustment is omitted, there is a possibility of control failure occurring due to secular changes, resulting in damage of the power synthesizing apparatus.

It is also necessary to perform overall adjustment in order to eliminate bad influence due to errors in the power distributing means 50 and the power synthesizing means 70 after assembly of the high-frequency power synthesizing apparatus. This adjustment is performed in such a manner that the level and relative phase difference of the output from each of the amplifiers 60a to 60h are set to predetermined values.

In the process of undertaking this adjustment, the output from each of the amplifiers 60a to 60h is adjusted after a corresponding one of the connection cables 80 which connect the power synthesizing means 70 and amplifiers 60a to 60h has been disconnected and after the amplifier has been connected to a measuring tool. Thereafter the connection cable 80 is connected again, thus completing the apparatus. One of the reasons for employing this process is that it is difficult to reproduce by any other method proper dispersion of the amplifiers 60a to 60h (temperature distribution, etc.) and dispersion of the cables 80 which must be observed after they have been mounted. In this adjustment, the operation of changing the connection of each cable 80 must be performed repeatedly, resulting in an increase in the number of assembly steps and in the possibility of cable connectors being damaged.

SUMMARY OF THE INVENTION

It is therefore an object of the present invention to provide a high-frequency power synthesizing apparatus which is reduced in overall size and which can be manufactured with improved productivity.

It is another object of the present invention to provide a high-frequency power synthesizing apparatus which is improved in durability and which allows the power output level to be smoothly changed from low to high.

It is still another object of the present invention to provide a high-frequency power synthesizing apparatus in which the total adjustment of amplifying means and other units can be performed rapidly and easily, and which is therefore improved in performance as well as in the facility with which it can be maintained and tested.

To these ends, the present invention provides a high-frequency power synthesizing apparatus having a power distributing means, an amplifying means comprising a plurality of amplifiers which amplify outputs from the power distributing means to predetermined levels, and a power synthesizing means.

In this apparatus, the power distributing means includes an initial-stage distributor which is supplied with the output from an excitation unit, and final-stage distributors which issue outputs to the above amplifying means and which comprising by 0°-hybrid modules.

The power synthesizing means includes initial-stage synthesizers which are supplied with outputs from the amplifying means and which comprise 0°-hybrid modules like the above final-stage distributors.

Changes in the level of the output for each amplifier is detected by a level detector, the result of this detection is compared with a predetermined level, and the output level is adjusted on the basis of this result by a loop control means provided for each amplifier. The detected level is displayed by an external display means which is detachably attached to the amplifying means.

BRIEF DESCRIPTION OF THE DRAWINGS

FIG. 4 is a block diagram of a second embodiment of the present invention;

DESCRIPTION OF PREFERRED EMBODIMENTS

Preferred embodiments of the present invention will be described below with reference to the accompanying drawings.

Figure 8:
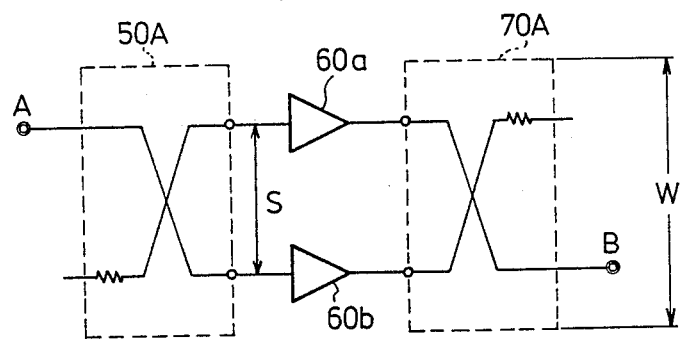
FIGS. 8 to 10 are illustrations of a case in which 90°-hybrid modules are used as power distributors connected to an amplifying means and as power synthesizers which are supplied with outputs from the amplifying means.
Figure 10:
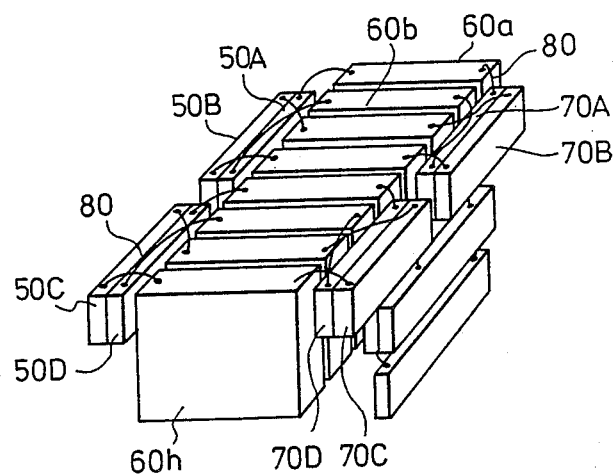
Figure 9:
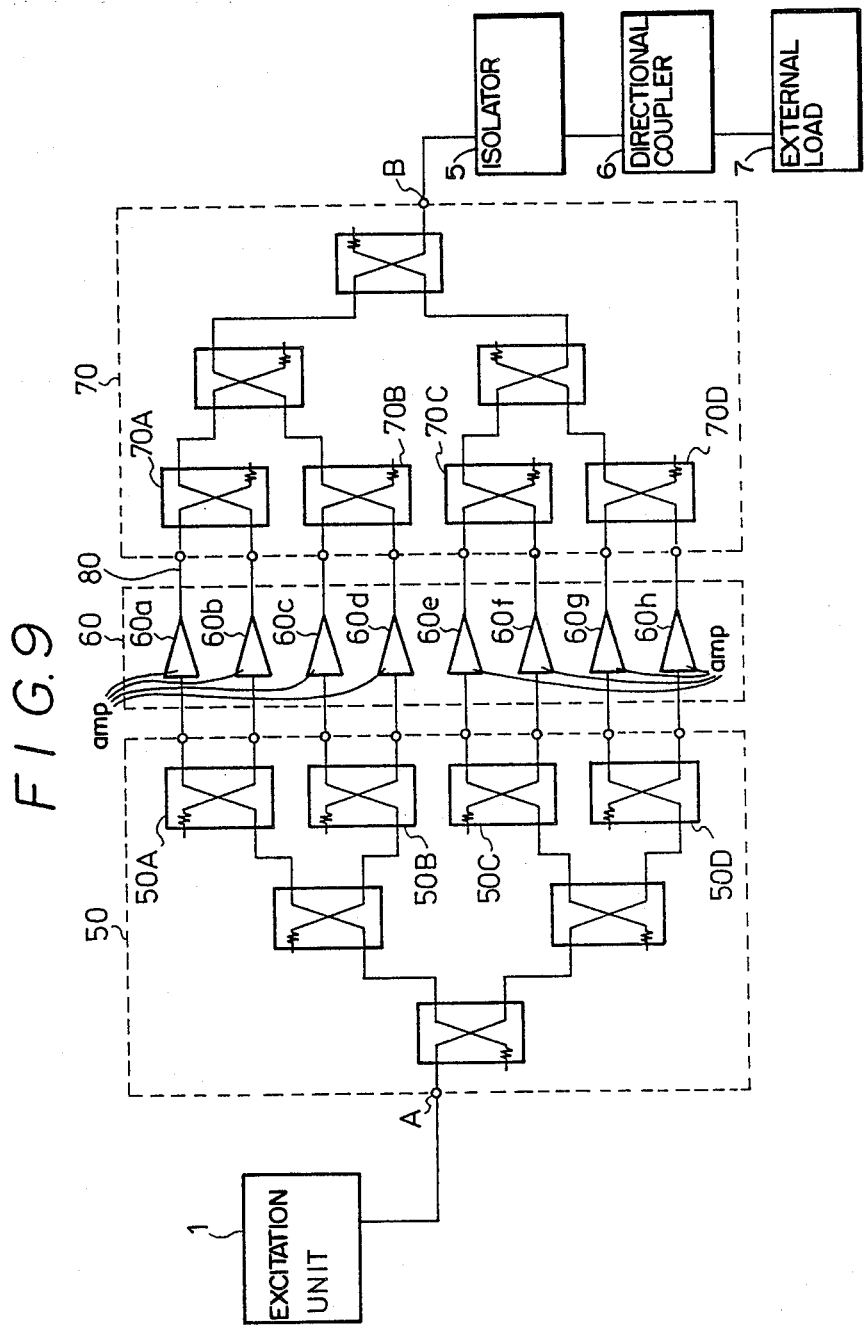

Components which are identical to those shown in FIGS. 8 to 10 are indicated by the same reference numerals, and the description for them will be omitted or simplified.

Figure 1:
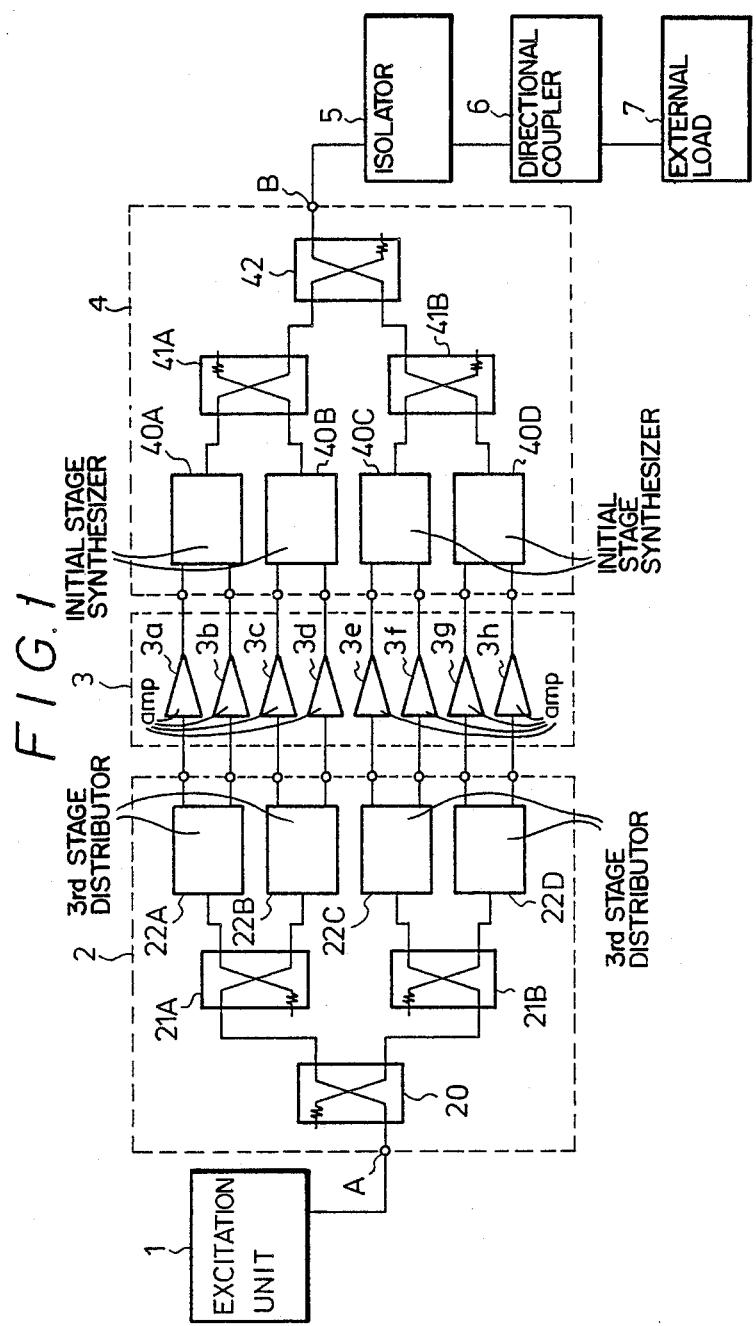
FIG. 1 is a block diagram of an apparatus which represents a first embodiment of the present invention.
Figure 2:
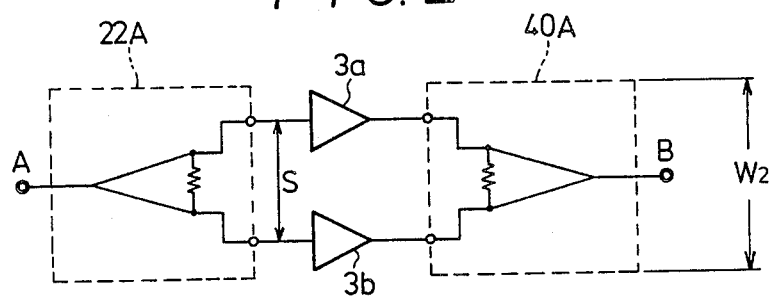
FIG. 2 is a diagram of part of the apparatus shown in FIG. 1.
Figure 3:
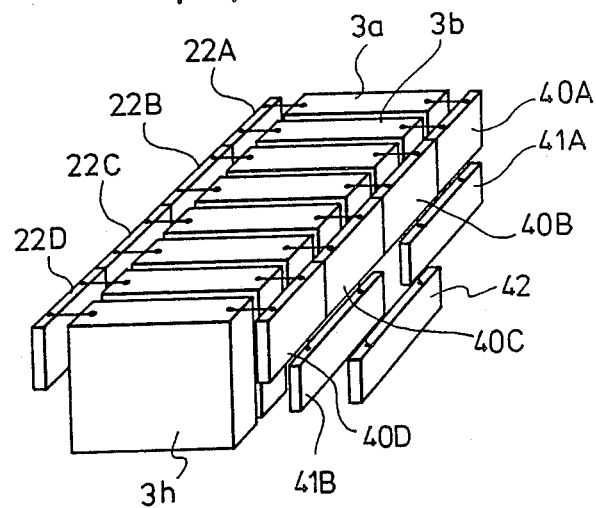
FIG. 3 is a schematic perspective view of the entire construction of the apparatus shown in FIG. 1.

FIGS. 1 to 3 show a high-frequency power synthesizing apparatus which represents a first embodiment of the present invention. In this embodiment, as shown in FIGS. 1 to 3, a power distributing means 2 is adapted to successively form eight outputs of the same level from input power. The outputs from the power distributing means 2 are supplied to an amplifying means 3 which is provided with eight high-frequency power amplifiers $3a$ to $3h$ having equal amplification factors, and which is adapted to simultaneously amplify powers supplied to input stages independently and simultaneously, and thereafter output them. The outputs from the amplifying means 3 are supplied to a power synthesizing means 4. All of these outputs are synthesized in this section and are thereafter outputted to an external load 7.

The power distributing means 2 is constituted by an initial-stage distributor 20 which issues two outputs by dividing an input supplied from the excitation unit 1 into two currents, second-stage distributors 21A and 21B which divide each of the outputs from the initial-stage distributor 20 into two currents, and third-stage distributors 22A to 22D which further divide each of the outputs from the second-stage distributors 21A and 21B into two currents. In these distributors, the initial-stage distributor 20 and the second-stage distributors 21A and 21B are 90°-hybrid modules of the same construction, while the four third-stage distributors 22A to 22D are 0°-hybrid modules of the same construction. Therefore, eight divided power signals to be amplified, which are of the same level and of a predetermined frequency and which are provided with predetermined phase difference, are supplied from the third-stage distributors 22A to 22D to the amplifiers $3a$ to $3h$.

The power synthesizing means 4, that is supplied with high-frequency power which has been amplified by the amplifiers $3a$ to $3h$, comprises four initial-stage synthesizers 40A to 40D, two second-stage synthesizers 41A and 41B which synthesize outputs from the initial-stage synthesizers 40A to 40D into two currents, and a third or final-stage synthesizer 42 which synthesizes outputs from the second-stage synthesizers 41A and 41D.

The initial-stage synthesizers 40A to 40D are 0°-hybrid modules of the same construction, and the second-stage synthesizers 41A and 41B and the third-stage synthesizer 42 are 90°-hybrid modules of the same construction.

As shown in FIG. 2, in the third-stage distributors 22A to 22D and the initial-stage distributors 40A to 40D that are 0°-hybrid modules, the distance S between the input and output terminals thereof can be selected as desired independently of the operating frequencies, and the structural dimensions of each 0°-hybrid module can be reduced without being limited in relation to the operating frequencies.

Each of the above-mentioned 0°-hybrid modules are a Wilkinson 0°-hybrid module, but other types of hybrid modules are also applicable.

Since, in power synthesis using 0°-hybrid modules only, the input-output reflection coefficient directly appears through the 0°-hybrid modules, improvement in the reflection coefficient cannot be expected. However, in this embodiment, each of the distributors 20, 21A, and 21B at the initial and second stages on the signal-input side and synthesizers 41A, 41B, and 42 at the second and third stages on the power-output side is of the 90°-hybrid type. The apparatus in accordance with this embodiment is thus designed to sufficiently improve the reflection coefficient.

In this embodiment, as described above, 0°-hybrid modules are used as the modules which constitute, in the power distributing means 2 and the power synthesizing means 4, the stages on the side of the amplifying means 3, thereby increasing the design freedom with respect to the distance between the terminals and, hence, enabling a reduction in the overall size of the mechanism including the amplifiers 3a to 3h, the distributors 22A to 22D, and the synthesizers 40A to 40D. For instance, in the high-frequency power synthesizing apparatus shown in FIG. 10, as described already, the distance between the terminals is much greater than the interval at which the amplifiers 60a and 60b can be disposed, and, therefore, the distributors 50A, 50B, . . . at the third stage (and the synthesizers 70A, 70B, . . . at the initial stage) must be superposed in a surface contacting manner, as shown in FIG. 10. In contrast, in the above-described embodiment, the total size of the apparatus can be reduced and the distributors 22A to 22D and synthesizers 40A to 40D can be suitably assembled by being disposed in a single layer without being superposed about each other (as shown in FIG. 3). At the same time, the arrangement of connection cables can be simplified, enabling the length of each connection cable to be reduced. The present invention thus makes it easy to assemble the modules while improving the heat sinking effect.

The above embodiment exemplifies the case in which 90°-hybrid modules are used to form two stages in each of the power distributing means 2 and the power synthesizing means 4. However, 90°-hybrid modules may be used as the initial-stage distributor 20 and the final synthesizer 42 only, while other components are formed of 0°-hybrid modules. The number of amplifiers is not specifically limited to eight, and it can be selected as desired while changing the power distributing means 2 and the power synthesizing means correspondingly.

Next, a second embodiment of the present invention will be described with reference to FIG. 4.

In this embodiment, the power distributing means 2 and the power synthesizing means 4 have the same constructions as those of the first embodiment, and the internal structure thereof is omitted in FIG. 4. A feature of the second embodiment resides in that, in the amplifying means 3, the output of each of amplifiers 31 can be adjusted so as to be constant.

That is, the amplifying means 3 is constituted by a reference-signal outputting means or reference-power outputting section 25 for outputting power of a reference level and by a plurality of regular power outputting sections 30. The reference-power outputting section 25 is constituted by an amplifier 31 and a monitor circuit 33 which forms an output-level detecting means connected to the output stage of the amplifier 31. The output of the amplifier 31 in the reference-power outputting section 25 is detected by the monitor circuit 33 and is simultaneously supplied as a reference level to the regular-power outputting sections 30.

Each of the regular-power outputting sections 30 is provided with an amplifier 31, a voltage-variable attenuator 32 which is connected to the input stage of the amplifier 31, and a loop control circuit 35 which compares an output signal supplied from a monitor circuit 33 connected to the output stage of the amplifier 31 with the reference signal supplied from the monitor circuit 33 of the reference power outputting section 25, and which drives and adjusts the voltage-variable attenuator 32 in response to the difference between these signals. A loop control means 30A is constituted by the voltage-variable attenuator 32 and the loop control circuit 35.

In this embodiment, the amplifier 31 is a class B amplifier, but other types, such as class A or C amplifiers are also applicable, and the number of the regular-power outputting sections 30 may be selected as desired. The loop control circuit 35 comprises a comparator and an integrator. The monitor circuit 33 may be formed of a combination of a directional coupler and a detecting diode.

The operation of each regular-power outputting section 30 thus constructed will now be described below.

Part of the output from the amplifier 31 of each regular-power outputting section is taken out as a monitor signal by the monitor circuit 33. In the loop control circuit 35, this monitor signal is compared with the reference signal supplied from the monitor circuit 33 of the reference-power outputting section 25. If there is a difference between these signals, the loop control circuit 35 immediately operates to control the voltage-variable attenuator 32 so as to reduce the difference. The output from the amplifier of each regular-power outputting section is thus made equal to the level of the output from the amplifier 31 of the reference-power outputting section 25.

As a result, the outputs from all of the amplifiers 31 are always equalized even if the gain characteristics of the amplifier 31 of each regular-power outputting section 30 differ from the others. The use of this method is not limited to the arrangement that makes use of class B amplifiers and is also effective for arrangements using class C amplifiers as well as those using class A or other type amplifiers.

It has been confirmed by experiment that, if the output levels are equalized, the phase characteristics of a plurality of amplifiers do not differ greatly even if the amplifiers are of a class B or C type. Therefore, in this embodiment which enables the output levels to be equalized, difference in the phase characteristics is not an important problem.

Also, in the second embodiment, the operation of the apparatus is not affected by external noise since a complete closed-loop control is performed. It is thereby possible to equalize the output levels of power amplifier modules fully automatically.

Figure 5:
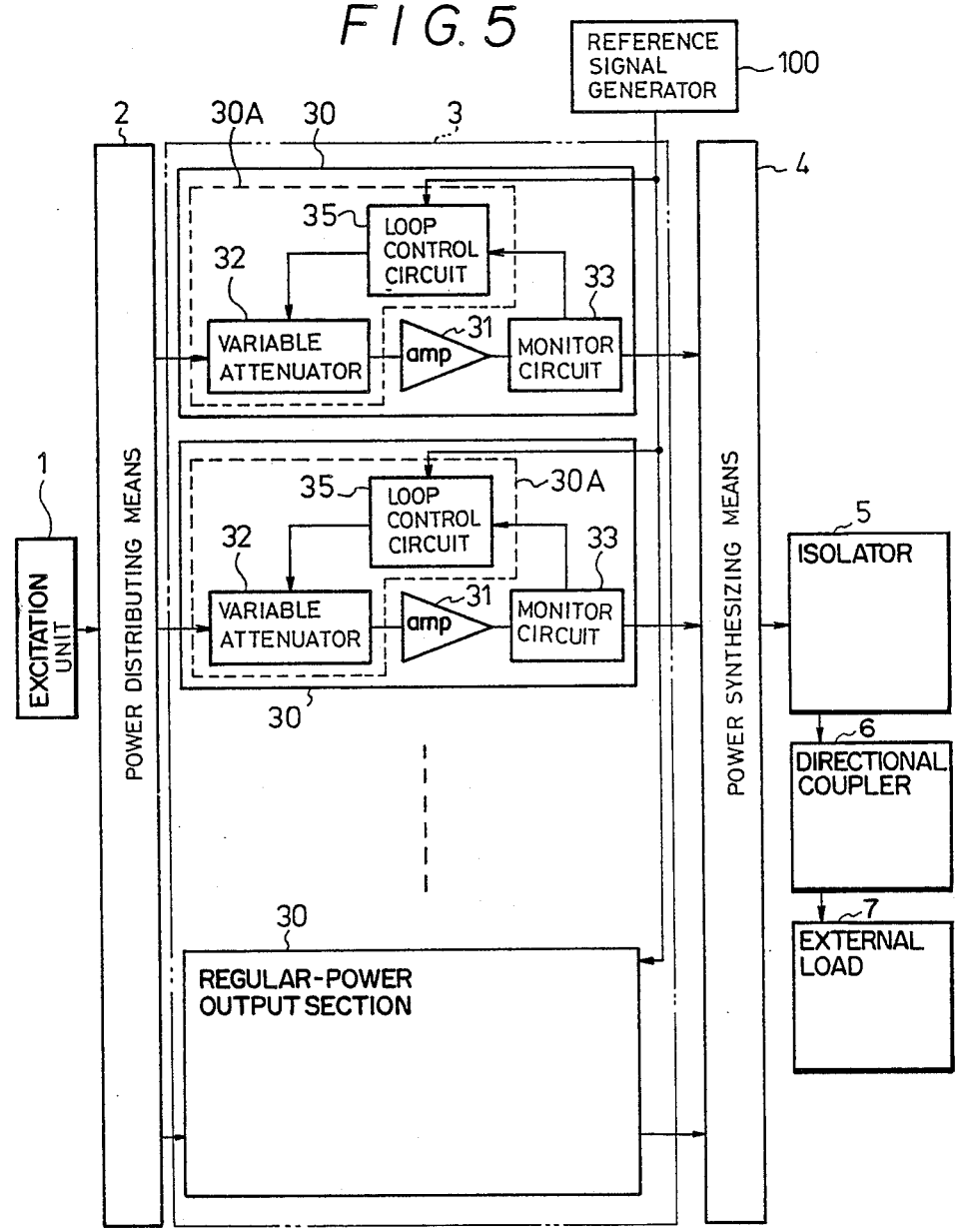
FIG. 5 is a block diagram of a third embodiment of the present invention.

Next, a third embodiment of the present invention will be described with reference to FIG. 5.

The third embodiment is substantially the same as the second embodiment, but the difference between them resides in that the former is provided with a reference signal generating means or reference signal generator 100 disposed outside the amplifying means 3 while the reference-power outputting section 25 in the latter is removed form the former.

The level of the output from the reference signal generator 100 is variable, and a reference signal output from the reference signal generator 100 is applied to the loop control circuit 35 of each regular-power outputting section 30 in which the same comparison and control operation as that in the second embodiment is performed.

The thus-constructed third embodiment is further improved compared with the second embodiment by disposing the reference signal generator 100 outside the amplifying means 3, thereby enabling, along with automatization, manual operation to be performed by the operator.

A fourth embodiment of the present invention will be described below with reference to FIG. 6.

This embodiment is constructed such that monitor circuits 33 which are provided as output-level detecting means are connected to the output stages of amplifiers 31, and the outputs from the monitor circuits 33 are supplied to a display means 120 via a change-over means 110 disposed outside and connected to the amplifying means, thereby enabling the output level of each amplifier 31 to be displayed by the display means 120.

In this construction, each of the amplifiers is preliminarily adjusted. After assembly, the apparatus can be operated for a short time so as to check the functions of each section without damaging the power synthesizing means 4 or other components.

In the process of overall adjustment, the change-over means 110 and the display means 120 are used to successively measure the output from each power amplifier module 31, and output adjustment is performed by using various adjustment means, finally realizing desired states of operation. The number of operations of disconnecting the cables is thereby reduced, and, hence, the working hours and the rate at which defectives occur are reduced.

Figure 6:
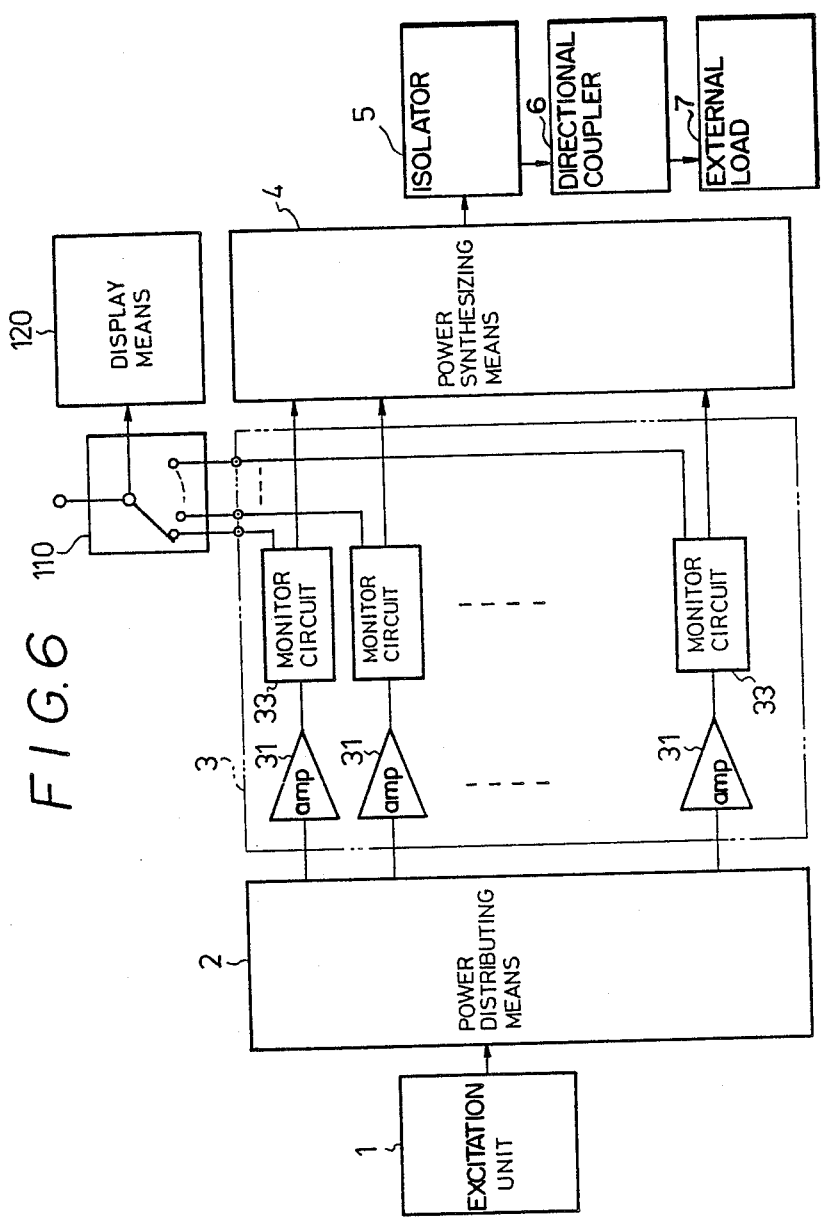
FIG. 6 is a block diagram of a fourth embodiment of the present invention.

The embodiment shown in FIG. 6 exemplifies the case in which the change-over means 110 and the display means 120 are used, but outputs from two or more power amplifier modules may be simultaneously displayed by a multi-channel display means while one of them is used as a reference output to perform overall adjustment by adjusting them relative to each other.

Usually, in the above-described embodiment, the patterns of the monitor circuits 33 can be formed in the amplifier circuit boards simultaneously with other patterns, and therefore there is no substantial increase in cost. In addition, this method enables a sufficient reduction in the dispersion of individual modules because of its improved working accuracy.

Figure 7:
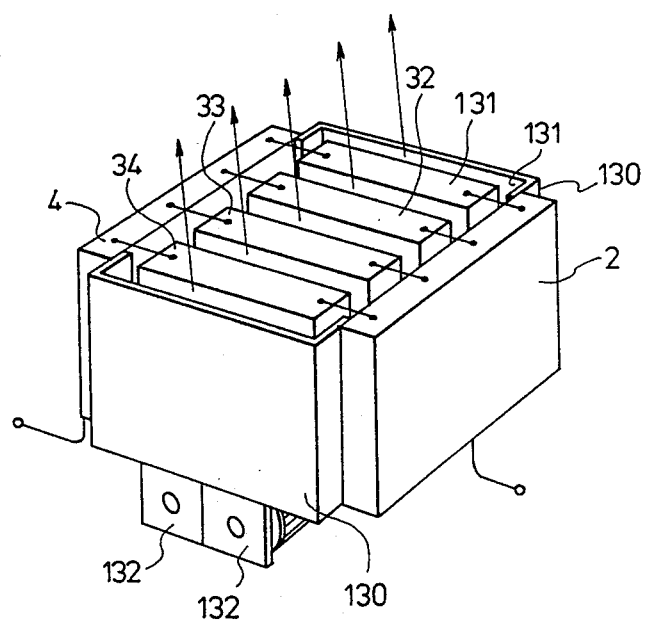
FIG. 7 is a schematic perspective view illustrating a fan mechanism which limits heating in the apparatus.

FIG. 7 shows a ventilation mechanism for limiting heating in the high-frequency power synthesizing apparatus. In this mechanism, ventilation guide plates 130 are disposed so as to encircle the amplifiers 31 in cooperation with the power distributing means 2 and the power synthesizing means 4, thereby forming a ventilation path 131 though which air which is supplied from a ventilation fan 132 flows upward as indicated by the arrows in FIG. 7, thereby preventing the apparatus from being overheated by the heat radiated from the components. This ventilation mechanism is applied to the apparatus in accordance with each of the above-described embodiments.

As described above, the present invention provides a high-frequency power synthesizing apparatus in which the overall size can be reduced and the output level can be changed smoothly from low to high, and which can be easily maintained and inspected.

What is claimed is:

1. A high-frequency power synthesizing apparatus comprising:
    (a) power distributing means comprising:
        (i) an initial-stage power distributor that receives an input signal to produce a desired output signal; and
        (ii) a plurality of final stage 0°-hybrid module distributors, said final-stage distributors receiving said output signal of said initial-stage power distributor;
    (b) means for amplifying to a predetermined level a plurality of signals outputted from said plurality of final-stage 0°-hybrid module distributors; and
    (c) power synthesizer means, comprising:
        (i) initial-stage 0°-hybrid module synthesizers that receive amplified signals from said amplifying means; and
        (ii) a final-stage synthesizer that receives signals outputted from said initial-stage 0° hybrid module synthesizers to produce an output signal.

2. A high-frequency power synthesizing apparatus according to claim 1, wherein said amplifying means includes a plurality of regular power output sections whose output signal levels are controlled by an output signal level of a reference-power output section.

3. A high-frequency power synthesizing apparatus according to claim 2, wherein each regular-power output section comprises:
    an amplifier;
    means for detecting said output signal level of said amplifier; and
    means for controlling said output signal level of said amplifier by comparing said output level from said detecting means with said output signal level of said reference-power output section.

4. A high-frequency power synthesizing apparatus according to claim 3, wherein said output signal level controlling means has a variable attenuator connected to the input of said amplifier, said output signal level controlling means controlling said variable attenuator so as to adjust said output signal level of said amplifier in said regular-power output section to substantially match said output signal level of said reference-power output section.

5. A high-frequency power synthesizing apparatus according to claim 1, further comprising:
    means for detecting said amplified signals of each of said plurality of amplifying means; and
    means for generating a reference level, said reference level generating means being interfaced to said amplifying means for adjusting said amplifying signal level of each of said amplifying means.

6. A high-frequency power synthesizing apparatus according to claim 5, wherein said reference level generating means is located outside said amplifying means.

7. A high-frequency power synthesizing apparatus according to claim 5, wherein said amplified signal level of each of said amplifying means is adjusted to be substantially equal to one another.

8. A high-frequency power synthesizing apparatus according to claim 5, wherein said reference level generating means is located outside said amplifying means and said amplified signal level of each amplifying means is adjusted to be substantially equal to one another.

9. A high-frequency power synthesizing apparatus according to claim 1, further comprising:
    means for detecting an output level signal of each of said amplifying means; and
    means for displaying said output level signal, said display means being connected to said detecting means.

10. A high-frequency power synthesizing apparatus according to claim 9, further comprising means for connecting each of said detecting means associated with each amplifying means to said display means.

11. A high-frequency power synthesizing apparatus according to claim 9, wherein said display means comprises a multi-channel display for simultaneously displaying said output level signal of a plurality of amplifying means.

12. A high-frequency power synthesizing apparatus according to claim 9, wherein said display means is detachably connected to said detecting means.

13. A high-frequency power synthesizing apparatus according to claim 11, wherein said display means is detachably connected to said detecting means.

14. A high-frequency power synthesizing apparatus comprising:
   (a) power distributing means, comprising:
      (i) an initial-stage 90°-hybrid module power distributor that receives an input signal to produce a desired output signal;
      (ii) a second-stage power distributor that receives a signal outputted from said initial-stage power distributor to produce desired output signals; and
      (iii) a plurality of final-stage 0°-hybrid module distributors that receive said output signals from said second-stage power distributor and output a plurality of signals;
   (b) means for amplifying to a predetermined level said output signals from said final-stage distributors; and
   (c) power synthesizer means, comprising:
      (i) a plurality of initial-stage 0°-hybrid module synthesizers that receive said output signals from said amplifying means to produce a desired output signal;
      (ii) a second-stage synthesizer that receives said output signal from said initial-stage synthesizer and produces a desired output signal; and
      (iii) a final-stage 90°-hybrid module synthesizer that receives said output signal from said second-stage synthesizer and produces a desired output signal.

15. The high-frequency power synthesizing apparatus according to claim 14, wherein said second-stage power distributor comprises a 90° hybrid module.

16. The high-frequency power synthesizing apparatus according to claim 14, wherein said second-stage synthesizer comprises a 90°-hybrid module.

17. The high-frequency power synthesizer apparatus according to claim 14, wherein said second-stage power distributor comprises a 0°-hybrid module.

18. The high-frequency power synthesizing apparatus according to claim 14, wherein said second-stage synthesizer comprises a 0° hybrid module.

19. The apparatus of claim 14, wherein said second-stage power distributor and said second-stage synthesizer comprise 90°-hybrid modules.

20. The apparatus of claim 14, wherein said second-stage distributor and said second-stage synthesizer comprise 0°-hybrid modules.

21. A high-frequency power synthesizing apparatus according to claim 14, wherein said amplifying means includes a plurality of regular power output sections whose output signal levels are controlled by an output signal level of a reference-power output section.

22. A high-frequency power synthesizing apparatus according to claim 21, wherein each regular-power output section comprises:
    an amplifier;
    means for detecting said output signal level of said amplifier; and
    means for controlling said output signal level of said amplifier by comparing said output level from said detecting means with said output signal level of said reference-power output section.

23. A high-frequency power synthesizing apparatus according to claim 22, wherein said output signal level controlling means has a variable attenuator connected to the input of said amplifier, said output signal level controlling means controlling said variable attenuator so as to adjust said output signal level of said amplifier in said regular-power output section to substantially match said output signal level of said reference-power output section.

24. A high-frequency power synthesizing apparatus according to claim 14, further comprising:
    means for detecting said amplified signals of each of said plurality of amplifying means; and
    means for generating a reference level, said reference level generating means being interfaced to said amplifying means for adjusting said amplified signal level of said ampliyfing means.

25. A high-frequency power synthesizing apparatus according to claim 24, wherein said reference level generating means is located outside said amplifying means.

26. A high-frequency power synthesizing apparatus according to claim 24, wherein said amplified signal level of each of said amplifying means is adjusted to be substantially equal to one another.

27. A high-frequency power synthesizing apparatus according to claim 24, wherein said reference level generating means is located outside said amplifying means and said amplified signal level of each amplifying means is adjusted to be substantially equal to one another.

28. A high-frequency power synthesizing apparatus according to claim 14, further comprising:
    means for detecting an output level signal of each of said amplifying means; and
    means for displaying said output level, said display means being connected to said detecting means.

29. A high-frequency power synthesizing apparatus according to claim 28, further comprising means for connecting each of said detecting means associated with each amplifying means to said display means.

30. A high-frequency power synthesizing apparatus according to claim 28, wherein said display means comprises a multi-channel display for simultaneously displaying said output level signal of a plurality of amplifying means.

31. A high-frequency power synthesizing apparatus according to claim 28, wherein said display means is detachably connected to said detecting means.

32. A high-frequency power synthesizing apparatus according to claim 30, wherein said display means is detachably connected to said detecting means.

* * * * *

UNITED STATES PATENT AND TRADEMARK OFFICE
CERTIFICATE OF CORRECTION

PATENT NO. : 4,868,520

DATED : September 19, 1989

INVENTOR(S) : T. TERAKAWA et al.

It is certified that error appears in the above-identified patent and that said Letters Patent is hereby corrected as shown below:

ON TITLE PAGE: left column on line 2 of the Foreign Application Priority Data, change "61-31404" to ---61-310404---;

column 1, line 30, change "to" to ---by--- after "power";
column 2, line 24, change "of of" to ---of---;
column 3, line 29, change "comprising by" to ---comprise---; and
column 6, line 59, change "form" to ---from---.

Signed and Sealed this

Thirteenth Day of August, 1991

*Attest:*

*Attesting Officer*

HARRY F. MANBECK, JR.

*Commissioner of Patents and Trademarks*